United States Patent
Sinha et al.

(10) Patent No.: US 11,093,675 B1
(45) Date of Patent: Aug. 17, 2021

(54) STATISTICAL TIMING ANALYSIS CONSIDERING MULTIPLE-INPUT SWITCHING

(71) Applicant: International Business Machines Corporation, Armonk, NY (US)

(72) Inventors: Debjit Sinha, Wappingers Falls, NY (US); Vasant Rao, Fishkill, NY (US); Michael Hemsley Wood, Wilmington, DE (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/823,300

(22) Filed: Mar. 18, 2020

(51) Int. Cl.
  *G06F 30/3312* (2020.01)
  *G06F 30/327* (2020.01)
(52) U.S. Cl.
  CPC ........ *G06F 30/3312* (2020.01); *G06F 30/327* (2020.01)
(58) Field of Classification Search
  CPC ........................... G06F 30/3312; G06F 30/327
  See application file for complete search history.

(56) References Cited

U.S. PATENT DOCUMENTS

| | | | |
|---|---|---|---|
| 5,692,160 A | 11/1997 | Sarin | |
| 6,378,113 B1 | 4/2002 | Levitsky et al. | |
| 6,721,929 B2 | 4/2004 | Li et al. | |
| 6,725,442 B1 * | 4/2004 | Cote | G01R 31/318519 716/100 |
| 7,412,670 B2 | 8/2008 | Meyer et al. | |
| 7,974,335 B2 * | 7/2011 | Park | H04L 25/03057 375/233 |
| 8,032,342 B2 | 10/2011 | Levy | |

(Continued)

FOREIGN PATENT DOCUMENTS

CN    105514983 A    4/2016

OTHER PUBLICATIONS

Sridharan et al.; "Gate delay modeling with multiple input switching for static (statistical) timing analysis"; 19th International Conference on VLSI Design held jointly with 5th International Conference on Embedded Systems Design (VLSID'06); Conference Paper | Publisher: IEEE (Year: 2006).*

(Continued)

*Primary Examiner* — Helen Rossoshek
(74) *Attorney, Agent, or Firm* — Erik Johnson; Otterstedt, Wallace & Kammer, LLP

(57) ABSTRACT

A statistical single-input switching (SIS) timing value is obtained for a first input of a device. A side input with an arc to a common output of a circuit is selected and a statistical skew for the first input and the selected side input of the circuit is obtained. An expected-value for a statistical scale factor distribution is convolved and computed based on the statistical skew. The statistical single-input switching (SIS) timing value is scaled with a final effective statistical scale factor based on the expected-value; optionally, sensitivities of the statistical timing value to variational parameters are chain-ruled with the sensitivities of the statistical skew to variational parameters; and a statistical timing analysis of a given VLSI design is generated based on the scaled (and optionally, chain-ruled) statistical single-input switching (SIS) timing value to create the improved VLSI circuit design.

20 Claims, 10 Drawing Sheets

(56) References Cited

U.S. PATENT DOCUMENTS

| | | | |
|---|---|---|---|
| 8,578,310 B2* | 11/2013 | Kalafala | G06F 30/3312 716/108 |
| 8,607,176 B2 | 12/2013 | Soreff et al. | |
| 8,860,502 B2* | 10/2014 | Gemmeke | G06F 30/327 327/538 |
| 9,501,608 B1 | 11/2016 | Allen et al. | |
| 9,727,676 B1 | 8/2017 | Saurabh et al. | |
| 2004/0002844 A1 | 1/2004 | Jess et al. | |
| 2010/0017173 A1* | 1/2010 | Fabin | G06F 30/367 703/2 |
| 2010/0313176 A1 | 12/2010 | Takahashi et al. | |
| 2012/0266119 A1 | 10/2012 | Soreff et al. | |
| 2018/0121585 A1* | 5/2018 | Cherupalli | G06F 30/3312 |

OTHER PUBLICATIONS

Chandramouli et al., Modeling the effects of temporal proximity of input transitions on gate propagation delay and transition time, In Proceedings of the 33rd annual Design Automation Conference, pp. 617-622. 1996.

Amin et al., A multi-port current source model for multiple-input switching effects in CMOS library cells, In 2006 43rd ACM/IEEE Design Automation Conference, pp. 247-252. IEEE, 2006.

Amelifard et al., A current source model for CMOS logic cells considering multiple input switching and stack effect, In Proceedings of the conference on Design, automation and test in Europe, pp. 568-573. 2008.

Agarwal et al., Statistical gate delay model considering multiple input switching, In Proceedings of the 41st annual Design Automation Conference, pp. 658-663. 2004.

Kumar et al., A probabilistic collocation method based statistical gate delay model considering process variations and multiple input switching, In Design, Automation and Test in Europe, pp. 770-775. IEEE, 2005.

Sinha et al., A unified framework for statistical timing analysis with coupling and multiple input switching, In ICCAD-2005. IEEE/ACM International Conference on Computer-Aided Design, 2005., pp. 837-843. IEEE, 2005.

Sridharan et al., Modeling multiple input switching of CMOS gates in DSM technology using HDMR, In Proceedings of the Design Automation & Test in Europe Conference, vol. 1, pp. 6-pp. IEEE, 2006.

Fukuoka et al., Statistical gate delay model for multiple input switching, in ASP-DAC, 2008, pp. 286-291.

Tang et al., Statistical delay calculation with multiple input simultaneous switching, In 2011 IEEE International Conference on IC Design & Technology, pp. 1-4. IEEE, 2011.

Chen et al., A new gate delay model for simultaneous switching and its applications, In Proceedings of the 38th annual Design Automation Conference, pp. 289-294. 2001.

Yanamanamanda et al., Uncertainty modeling of gate delay considering multiple input switching, In 2005 IEEE International Symposium on Circuits and Systems, pp. 2457-2460. IEEE, 2005.

Lütkemeyer et al., A Practical Model to Reduce Margin Pessimism for Multi-Input Switching in Static Timing Analysis of Digital CMOS Circuits, TAU Mar. 12, 2015, 44 pages.

* cited by examiner

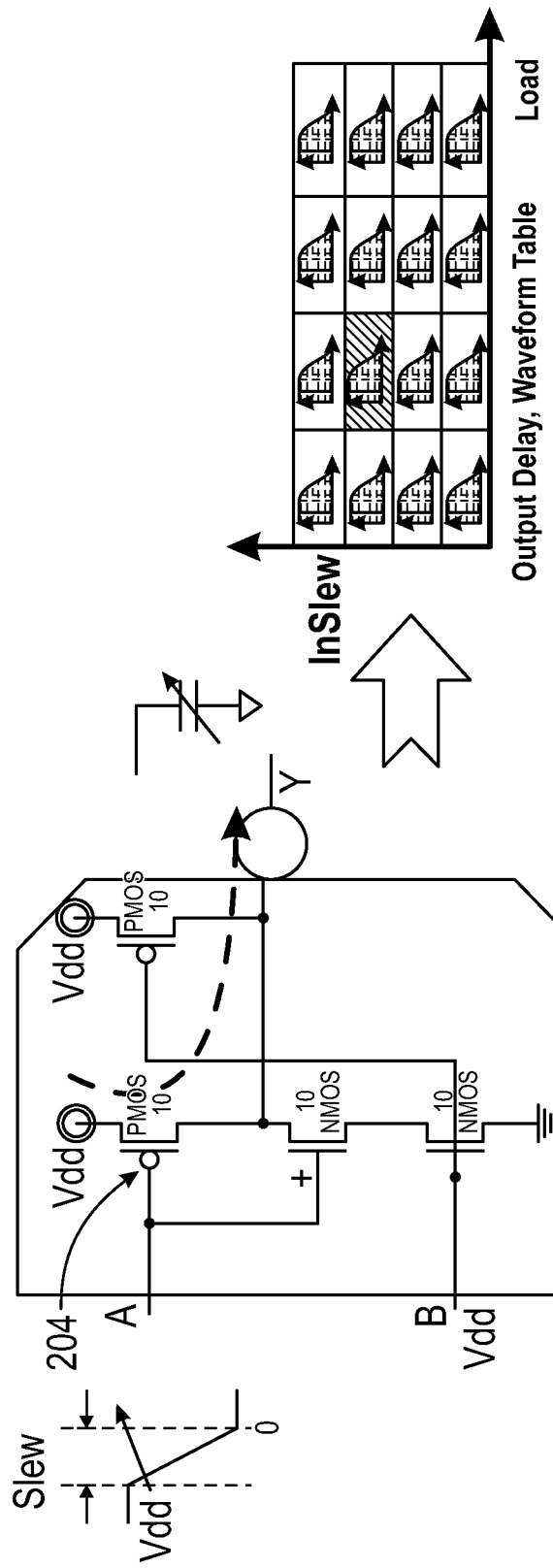

STATISTICAL TIMING ANALYSIS CONSIDERING MULTIPLE-INPUT SWITCHING

BACKGROUND

The present invention relates to the design of integrated circuits (ICs), and more specifically, to VLSI designs and devices based on the timing analysis and optimization of such circuits.

In VLSI (very large scale integration) digital design, fabricated devices conventionally include millions of transistors implementing hundreds of storage devices, functional logic circuits, and the like. The designs are often segmented or partitioned into sub-blocks (such as cores, units, macros, sub-hierarchies, and the like) to make the design process more manageable. For example, the design, placement, and routing of the circuits may be conducted at both a high-level and sub-block level, where the high-level considers the complete device including all sub-blocks (known as in-context design) and the sub-block level considers the design of a single sub-block (known as out-of-context design). While a sub-block level design may be used in multiple instances within the device, conventionally, only a single version of the design of the sub-block is produced.

Timing considerations for a sub-block conventionally include constraints, such as the specification of the arrival time (AT) for each input signal at the entry of the sub-block and the specification of a required arrival time (RAT) for generating each output signal of the sub-block. The required arrival time must consider the propagation delay through the circuit, including the slew rate of the output signal. Note that the arrival time may vary between different input signals and the required arrival time may vary between different output signals.

The timing performance of a circuit may be analyzed with deterministic or statistical timing analysis. Statistical static timing analysis (SSTA) is a technique that models the uncertainty in timing components of the circuit during timing analysis. Traditional SSTA using available single-input switching based gate delay libraries conventionally either ignores the timing impact from multiple-input switching (MIS) or uses single-corner (deterministic) models for MIS consideration.

SUMMARY

Principles of the invention provide techniques for statistical timing analysis considering multiple-input switching. In one aspect, an exemplary method for creating an improved very large scale integration (VLSI) circuit design includes the operations of obtaining a statistical single-input switching (SIS) timing value for a first input of a device; selecting a side input with an arc to a common output of a circuit; obtaining a statistical skew for the first input and the selected side input of the circuit; convolving and computing an expected-value for a statistical scale factor distribution based on the statistical skew; scaling the statistical single-input switching (SIS) timing value with a final effective statistical scale factor based on the expected-value; and generating a statistical timing analysis of a given VLSI design based on the scaled statistical single-input switching (SIS) timing value to create the improved VLSI circuit design. Optionally, chain ruling of the scaled statistical value with sensitivity of skew to variational parameters is performed.

In one aspect, a non-transitory computer readable medium comprises computer executable instructions which when executed by a computer cause the computer to perform the method of obtaining a statistical single-input switching (SIS) timing value for a first input of a device; selecting a side input with an arc to a common output of a circuit; obtaining a statistical skew for the first input and the selected side input of the circuit; convolving and computing an expected-value for a statistical scale factor distribution based on the statistical skew; scaling the statistical single-input switching (SIS) timing value with a final effective statistical scale factor based on the expected-value; and generating a statistical timing analysis of a given VLSI design based on the scaled statistical single-input switching (SIS) timing value to create the improved VLSI circuit design.

In one aspect, an apparatus comprises a memory; and at least one processor, coupled to said memory, and operative to perform operations comprising obtaining a statistical single-input switching (SIS) timing value for a first input of a device; selecting a side input with an arc to a common output of a circuit; obtaining a statistical skew for the first input and the selected side input of the circuit; convolving and computing an expected-value for a statistical scale factor distribution based on the statistical skew; scaling the statistical single-input switching (SIS) timing value with a final effective statistical scale factor based on the expected-value; and generating a statistical timing analysis of a given VLSI design based on the scaled statistical single-input switching (SIS) timing value to create the improved VLSI circuit design.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) (e.g., a computer) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

augmentation of the existing statistical single-input switching (SIS) delay with a statistical scale factor and chain rule-based sensitivity updates;

compatible with industry-standard pre-characterized SIS timing libraries and deterministic scale factor-based MIS models;

avoidance of (potentially expensive) re-computation of base SIS gate and transistor timing, during incremental timing analysis, when only input arrival times change, and limited to (non-expensive) statistical scale factor re-computation, thereby improving timing run-time efficiency;

negligible run-time overheads while accurately exposing timing slack optimism in an SIS-based flow (as demonstrated by experimental results in a commercial SSTA framework);

prediction of timing critical paths due to MIS that show excellent correlation to silicon hardware;

compatible with existing deterministic MIS model and SIS-aware statistical timing flows;

elimination of repetitive "computation expensive" base SIS statistical delay calculation when only the AT skew changes;

reduced design cycle time;

reduced number of design iterations;

improved designer efficiency;

optimized designs that operate at intended design specifications; and improved performance of integrated circuits designed using aspects of the invention, as compared to those not designed using aspects of the invention, at least under conditions where there is the same CPU time budget for the design process.

These and other features and advantages of the present invention will become apparent from the following detailed description of illustrative embodiments thereof, which is to be read in connection with the accompanying drawings.

BRIEF DESCRIPTION OF THE DRAWINGS

FIG. 2A illustrates single-input switching for a 2-input NAND gate where a falling input transition on input A produces a rising output transition on output Y with a capacitive load;

FIG. 2B is a cell timing library table for a gate timing library which characterizes the delay for each input-output pair of the NAND gate of FIG. 2A;

DETAILED DESCRIPTION

I. Introduction

Generally, methods and systems for improving VLSI designs and devices by modeling the impact of multiple-input switching on statistical timing using concepts of convolution and chain ruling are disclosed. In one example embodiment, static timing analysis (STA) models a circuit design as a (timing) graph and identifies the longest and shortest (timing) paths in the graph to verify if they violate timing constraints, such as setup and hold times. This information guides timing optimization and registers the current state of the design. STA propagates timing attributes (such as arrival times, slews, slacks, and the like) through the timing graph which involves computing delays through gate- and wire-edges of the graph. Efficient gate delay computation is facilitated by providing pre-characterized gate timing libraries as inputs to the STA tool, often in industry standard formats like the effective current source model (ECSM) and composite current source (CCS) model.

Timing library generation for logic gates involves characterizing the delay and output voltage waveform of timing arcs between various pairs of input and output pins of each gate across a range of input-slews (or voltage waveform shapes) and output-capacitive loads using an accurate circuit simulator. Multiple-input logic gates (like NAND and NOR gates) are traditionally characterized using the assumption of single input switching (SIS). In this approach, all inputs other than the one under consideration are set to an enabling logic 0 (low) or 1 (high) state, while the relevant input is simulated with a voltage-rising or -falling transition for timing measurements. In certain cases, this assumption can cause significant over-estimation or under-estimation of delays due to multiple-input switching (MIS) events. The disclosed techniques are applicable to a variety of devices, including gates, transistors and transistor-based circuits, and the like.

Figure 1A:
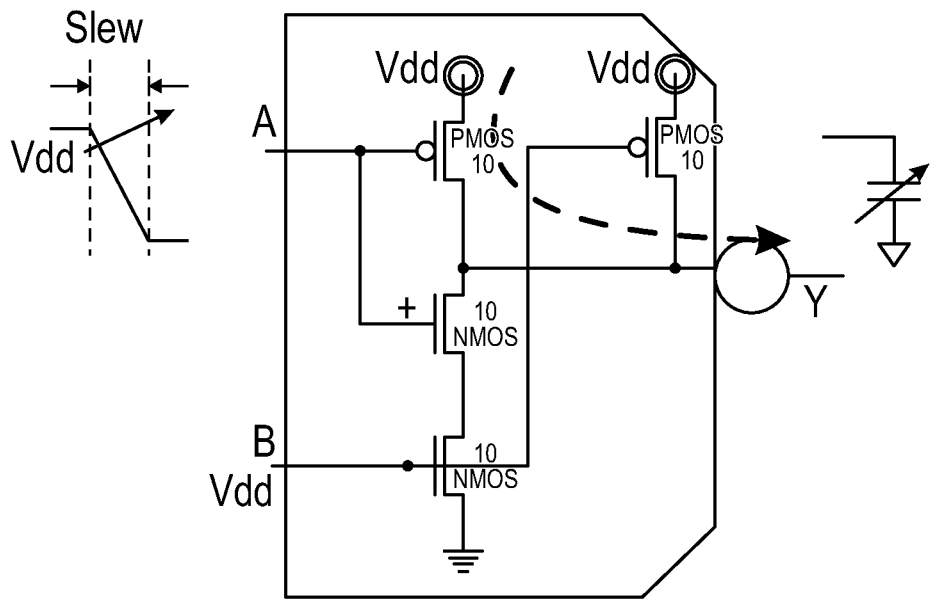
FIG. 1A illustrates single-input switching for a 2-input NAND gate where a falling input transition on input A produces a rising output transition on output Y.
Figure 1B:
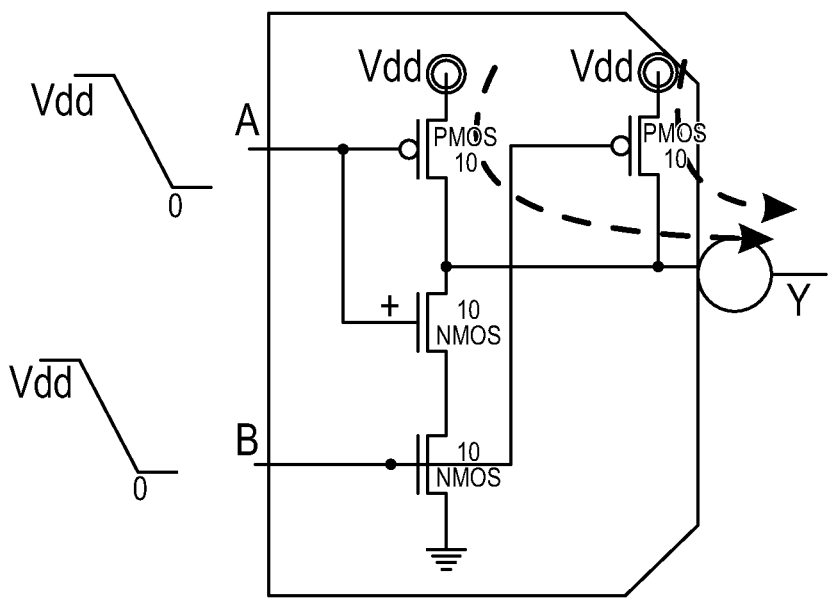
FIG. 1B illustrates multiple-input switching for a 2-input NAND gate where a falling input transition on input A and input B produce a rising output transition on output Y.

FIG. 1A illustrates single-input switching for a 2-input NAND gate where a falling input transition on input A produces a rising output transition on output Y. FIG. 1B illustrates multiple-input switching for a 2-input NAND gate where a falling input transition on input A and input B produce a rising output transition on output Y. One aspect of timing analysis is concerned with the delay for a signal to propagate from the input to the output of a circuit or device, such as the 2-input NAND gate of FIGS. 1A and 1B. As illustrated in FIGS. 1A and 1B, in SIS, the propagation delay and slew rate of the output signal is driven by input A while input B is held at logic 1 (high) state, whereas, in MIS, the propagation delay and slew rate of the output signal is driven by input A and input B when both inputs are switching in a close temporal proximity.

FIG. 2A illustrates single-input switching for a 2-input NAND gate where a falling input transition on input A produces a rising output transition on output Y with a capacitive load. FIG. 2B is a cell timing library table for a gate timing library which characterizes the delay for each input-output pair of the NAND gate of FIG. 2A. In one example embodiment, the table is based on the slew rate of the input signal and the capacitive load on the output signal. Based on the slew rate and the capacitive load, the table is used to look up the approximate delay for the corresponding input-output pair. The look up is performed before timing analysis is performed for a VLSI design and is captured in a timing library. Conventionally, any side inputs (the remaining inputs to the gate under consideration) are maintained at a constant voltage level. In some cases, the delay is looked up while maintaining the side inputs at a number of different voltage levels and the worst case delay is selected. In any case, the simultaneous, or substantially simultaneous, transition of two or more inputs is not conventionally considered. This is known in the art as single input switching timing analysis.

If the side-input B is held at a logic high state (as in the case of SIS), the output capacitance is charged via the conducting path through only one p-channel Field-effect Transistor (PFET) device 204. However, if both inputs A and B have simultaneous, or near simultaneous, switching (such as simultaneous falling transitions), the output capacitance is charged via two parallel conducting paths. This is known in the art as multiple input switching. The gate delay in this case can be substantially impacted, such as with a delay that is roughly half of that estimated by a SIS model.

Figure 4:
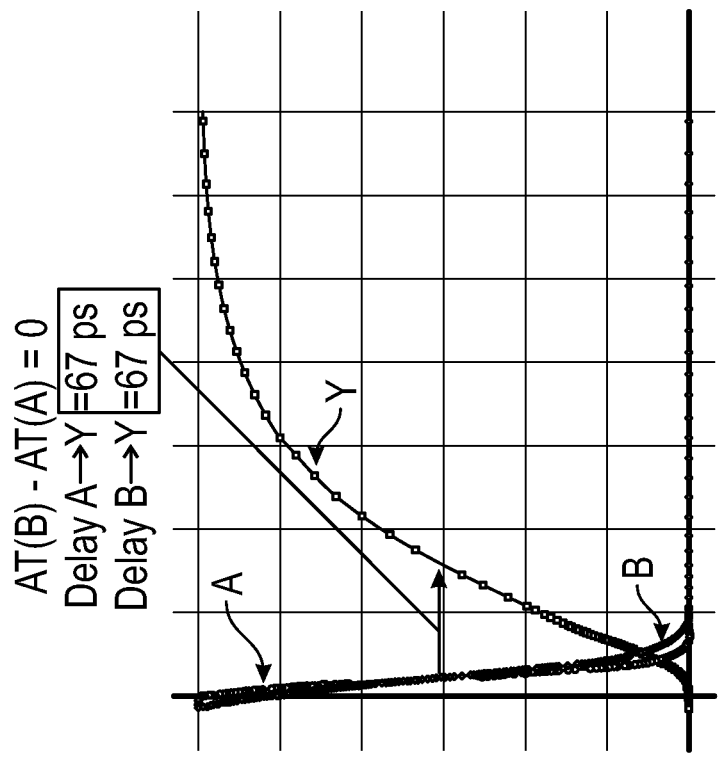
FIGS. 3 and 4 illustrate the voltage waveforms at the inputs and outputs of a NAND gate from a 14-nanometer technology library for multiple-input switching.
Figure 3:
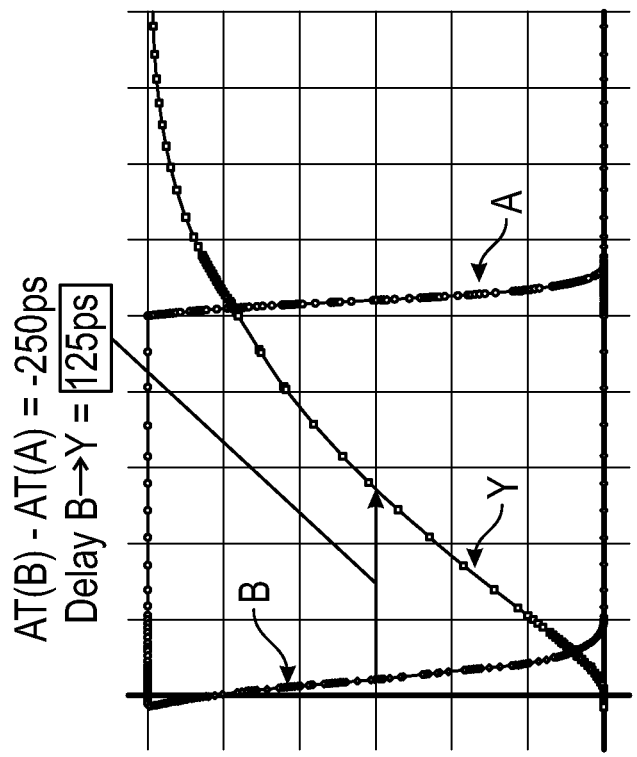

FIGS. 3 and 4 illustrate the voltage waveforms at the inputs and outputs of a NAND gate from a 14-nanometer technology library for multiple-input switching. As illustrated in FIG. 3, when the A input transitions substantially after the B input, the effect of the A input is relatively minimal and the propagation delay is 125 ps. As illustrated in FIG. 4, when the A input transitions at substantially the same time as the B input, the effect is substantial; the propagation delay is reduced to 67 ps. Thus, MIS can cause changes to the delay experienced for certain transitions of multiple input gates (like falling transitions on the inputs of a NOR gate). While simultaneous switching is an extreme case of MIS, multiple-inputs of a gate switching in a window of temporal proximity impacts timing and can also cause glitches. When the transitions of the A input and B input coincide (skew=0), the effect on the delay is maximal. As the skew increases, the effect diminishes. When the transitions of the A input and B input coincide (skew=0), a fast output slew rate is attained. As the skew increases, the output slew rate slows.

With technology scaling and an increased significance of manufacturing process and environmental variability, static timing analysis tools are used to account for a multitude of voltage, temperature, and process (front- and back-end of line) uncertainty effects on timing while being computationally efficient. Variation-aware STA has naturally become the standard for industrial timing analysis tools, and is performed either as multi-corner STA or statistical static timing analysis. Statistical static timing analysis (SSTA) captures the impact of variability on timing in a single (or few) run(s) by encapsulating timing attributes (such as delays, slacks, and the like) in a parameterized form, where the impact of each source of variation is quantified as a sensitivity. With newer technologies and increasing variability, SSTA has evolved to include several tens of variation sources with Gaussian, non-Gaussian, and other nonlinear statistical models for improved accuracy.

Figure 5:
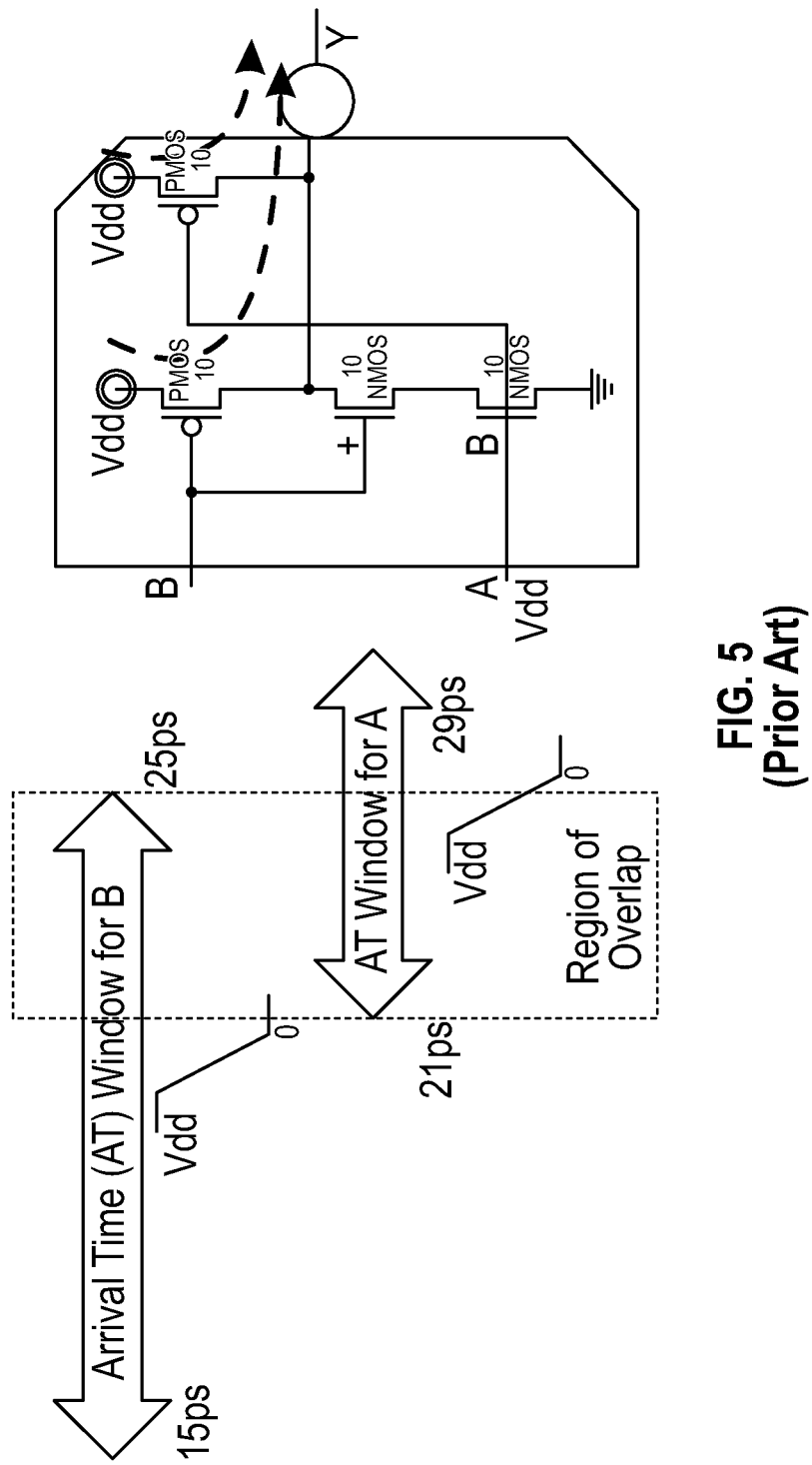
FIG. 5 illustrates one conventional model for deterministic MIS timing analysis.

FIG. 5 illustrates one conventional model for deterministic MIS timing analysis. As illustrated in FIG. 5, the conventional model computes the arrival time (or arrival time range) for the A input and the arrival time (or arrival time range) for the B input. For multiple switching, it then considers the window where the transitions overlap. In some cases, the window covers the exact overlap range. In other cases, the window is larger than the overlap range. Based on this window, the model determines a scale factor by which the entries in the look up table for SIS timing analysis can be multiplied to determine a propagation delay for use in deterministic MIS timing analysis. The table may be a function of slew; a function of skew and load; and the like. In conventional systems, if there is anticipated overlap of the A input and the B input, the scale factor is utilized; if there is no anticipated overlap, the scale factor is not used. In other words, use of the scale factor could be a binary decision.

Figure 6A:
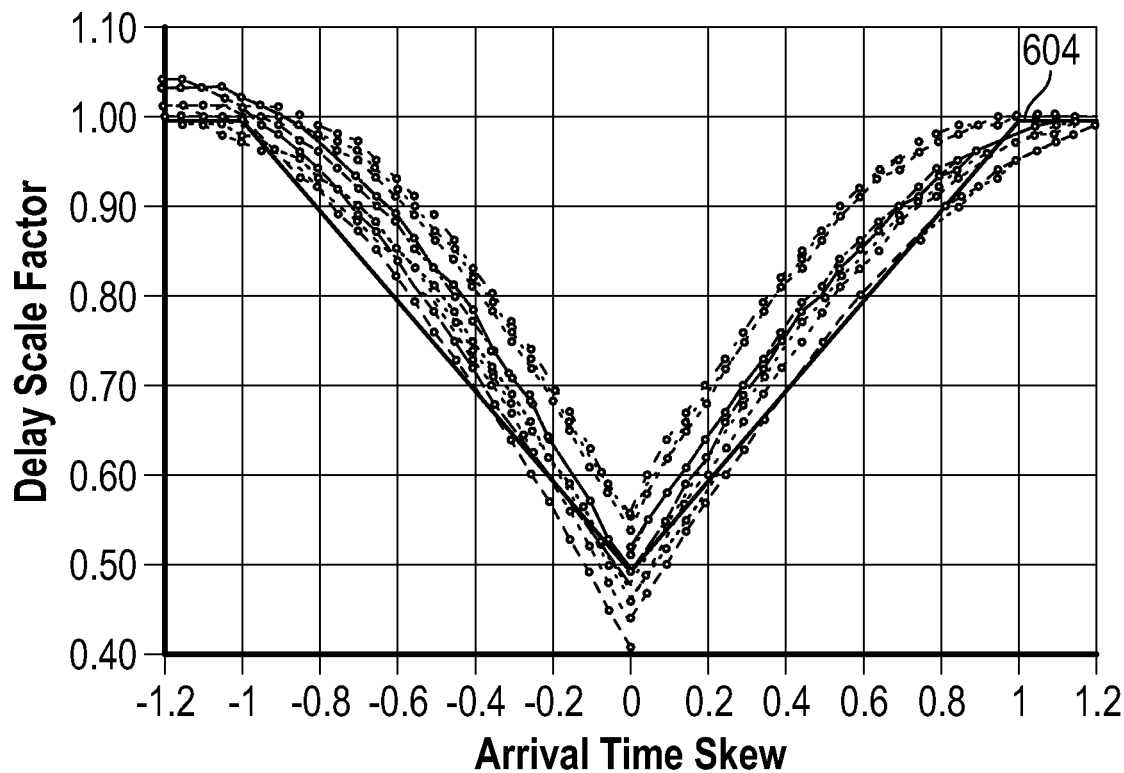
FIGS. 6A and 6B illustrate an estimated scale factor function for an SIS model in terms of skew, in accordance with an example embodiment.
Figure 6B:
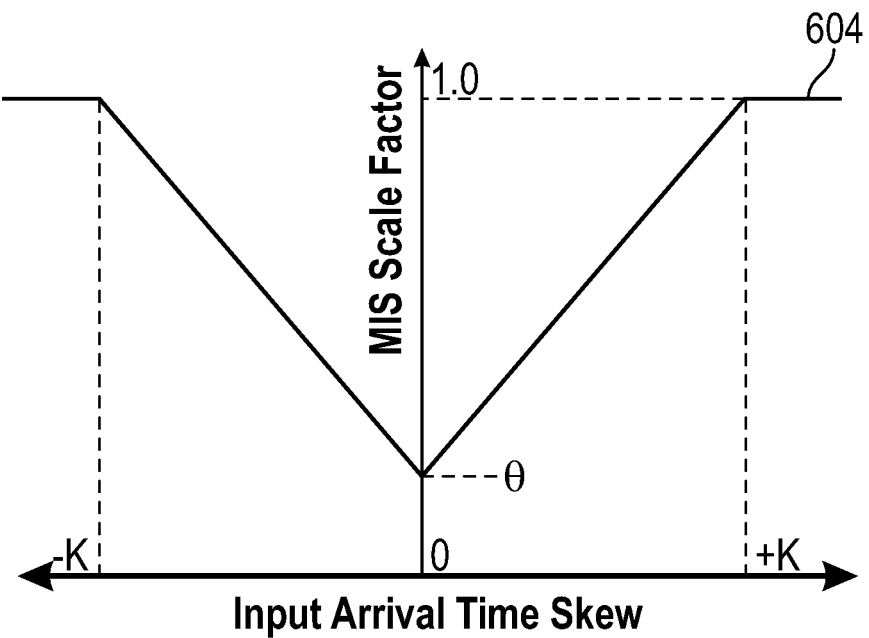

FIGS. 6A and 6B illustrate an estimated scale factor function for an SIS model in terms of skew, in accordance with an example embodiment. As illustrated in FIGS. 6A and 6B, if the skew is zero, the scale factor is approximately 0.5, meaning the propagation delay will be half that defined by the SIS model. As the skew increases, the propagation delay will slowly increase to a maximum of 1.0, meaning the propagation delay is the same as that defined by the SIS model.

Due to variations in manufacturing process, variations in voltage, variations in temperature, and the like, it is preferable to use statistical timing analysis to model the uncertainty in timing from the aforementioned sources of variation. In statistical timing analysis, everything considered as a number in deterministic timing analysis, such as signal arrival times, skews, propagation delays, and the like, is considered as a range with a corresponding probability distribution function.

Figure 7B:
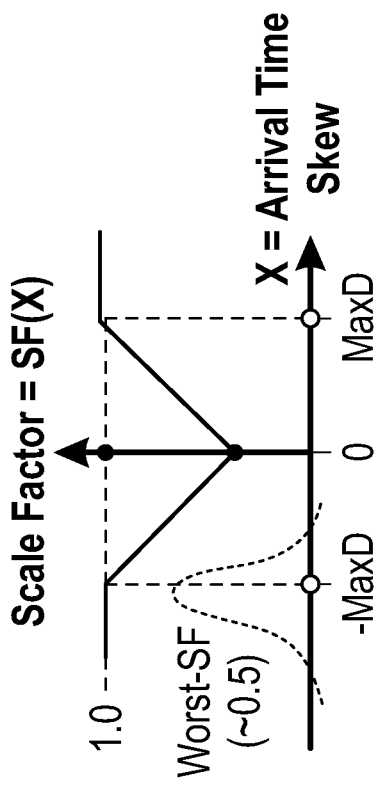
FIGS. 7A and 7B illustrate an estimated scale factor function for an SIS model in terms of skew based on Method 1, in accordance with an example embodiment.
Figure 7A:
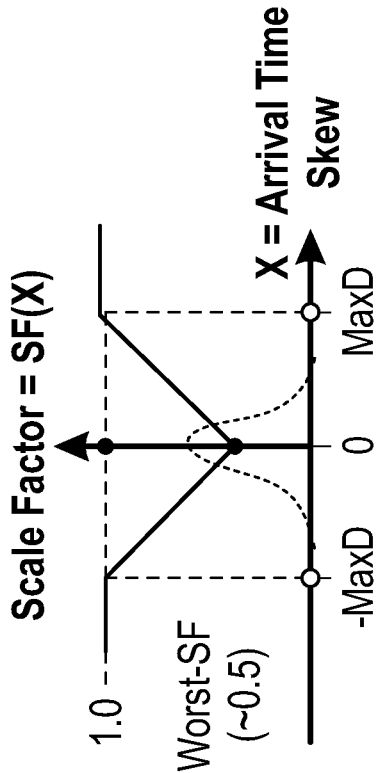

In a first example embodiment (Method 1 below), a scale factor corresponding to the average value of the skew is selected (knowing that the scale factor is a function of the skew). FIGS. 7A and 7B illustrate an estimated scale factor function for an SIS model in terms of skew based on Method 1, in accordance with an example embodiment. Use of a scale factor corresponding to the average value of the skew may lead to unacceptable errors, as illustrated in FIGS. 7A and 7B. As illustrated in FIGS. 7A and 7B, Method 1 would produce scale factors of 1 and 0.5 for the two cases, respectively, while the correct values intuitively would be smaller than 1 and larger than 0.5, respectively. These illustrative cases highlight that Method 1 could be both optimistic and pessimistic in different cases.

In one example embodiment, instead of directly computing MIS delays, the method augments the existing statistical SIS delay with a statistical scale factor and chain rule-based sensitivity updates. The method is compatible with industry standard pre-characterized SIS timing libraries and deterministic scale factor-based MIS models. During incremental timing, if only input arrival times change, (expensive) re-computation of base SIS gate timing is avoided and is limited to (non-expensive) statistical scale factor re-computation, thereby improving timing run-time efficiency.

II. Scale Factor Based Deterministic MIS Model

Traditional timing library generation for logic gates involves characterizing the delay and output voltage waveform of timing arcs between various pairs of input and output pins of each gate across a range of input-slews and output capacitive loads using an accurate circuit simulator. Library characterization under MIS would add the relative difference of signal arrival-times between pairs of gate inputs (arrival time skew) as an extra dimension during characterization and is thus undesirable. Assuming the worst case, multiple-input signal alignment (simultaneous switching) causes unrealistic and extreme pessimism in STA. Consequently, commercial timing libraries are generated with SIS assumptions.

At the same time, the impact of MIS on timing is acknowledged to be non-trivial and considered a must-have for modern STA tools. The industry standard approach is to specify worst case delay scale factors for each gate-type that may have a timing impact from MIS. During STA, these factors are applied to the SIS gate delays. Similar factors may also be specified for output slews. STA tools apply timing window analysis to estimate if any MIS scale factors should be applied for a given gate instance in a design. The window analysis is similar to that for coupling noise analysis, and sophisticated models allow the selection of a scale factor between 1.0 and the specified worst case scale factor depending on the skew between multiple inputs.

Without any loss of generality, in one example embodiment, a scale factor-based model is selected for capturing MIS impact on gate timing that decreases the gate delay (useful for min analysis or hold test analysis). A similar model applies to gate output-slews and MIS impact for increased gate delays (useful for max analysis or setup test analysis). Given the SIS delay $d_i$ of an arc in a gate from input pin i to a certain output pin, the MIS delay $d_{ij}$ of that arc with respect to a switching side input j is a function of the skew $\delta_{ij}$ between the arrival times $a_i$ and $a_j$ of the inputs i and j, respectively. Mathematically:

$$\delta_{ij} \stackrel{\Delta}{=} a_j - a_i, \text{ and} \quad (1)$$

$$d_{ij}(\delta_{ij}) = \Theta_{ij}(\delta_{ij}) \times d_i, \quad (2)$$

where $\Theta_{ij}$ denotes a scale factor that is applied on the SIS gate delay to obtain the MIS delay. $\Theta_{ij}$ is defined specifically for each gate type in the timing library that can be impacted by MIS, is specified for each pair of gate inputs i and j, is transition specific, and typically saturates to a value of 1.0 as $|\delta_{ij}|$ exceeds a certain threshold (typically a function of output slew). This model allows using an existing SIS-based timing library during STA while considering MIS effects.

To validate the feasibility and accuracy of such a model, circuit simulations are performed across different types of gates from a commercial 14 nanometer technology library. Gates chosen for the simulations include different sizes of NAND, NOR (2 to 4 inputs), and AOI (and-or-invert) and OAI (or-and-invert) cells. For each gate, for a given pair of inputs that can cause MIS timing impact, the MIS delay is compared to the SIS delay while varying input slews, output loads, and the input arrival time skew. Normalizing the skew as a function of the slew and observing the MIS delay to SIS delay ratio highlights that a simple V shaped MIS scale factor model can reasonably capture the delay ratio as a function of skew.

FIG. 6A illustrates the experimental results for a 2 input NAND gate with falling transition of the inputs, in accordance with an example embodiment. It plots the MIS to SIS delay ratio as a function of normalized skew between the input arrival times. Each curve in the figure shows the scale factor function for different combinations of input slew and output load. The dark line 604 in FIGS. 6A and 6B illustrates that the choice of a V-shaped MIS scale factor model is generally conservative for STA. Similar plots are observed for the different gates in the library. The V-shaped scale factor model $\Theta(\delta)$ is mathematically defined as:

$$\Theta(\delta) = \begin{cases} \theta + \frac{(1-\theta)|\delta|}{\kappa} & |\delta| \le \kappa \\ 1.0 & |\delta| > \kappa \end{cases} \quad (3)$$

where $\theta$ denotes the theoretical worst case scale factor for a given gate arc, a side input, and input transitions. As an example, for a balanced 2 input NAND gate, $\theta$ is 0.5 for falling transitions of the inputs. In (3), $\kappa$ denotes the bounds of the temporal proximity window within which MIS impacts gate delays, and is typically a function of the slew of the timing arc. During STA, the MIS scale factor $\Theta$ is computed based on the skew between the arrival times of the gate inputs, and is applied to obtain MIS impacted gate delays. For gates with more than 2 inputs, the scale factor is computed for each side-input, and the worst scale-factor is applied. This avoids too much pessimism from assuming all inputs switching, although a general multi-input model can be used as well. Output-slews may be scaled with a similar model. FIG. 6B illustrates the model pictorially.

III. Statistical Timing

A set of global parameters or sources of variation are denoted as: $X_1, X_2, \ldots, X_N$. A non-separable statistical timing model is used in one or more embodiments. In this model, a statistical timing value T (such as delay, slew, arrival-time, slack, and the like) is represented in a canonical form as:

$$T = t_0 + \sum_{i=1}^{N} t_i X_i + \sum_{i=1}^{N} \sum_{j=i+1}^{N} t_{ij} X_i X_j, \quad (4)$$

where $t_0$ is the mean of the timing value T and denotes the nominal value of T in the absence of variability, $t_i$ denotes the sensitivity of T to a parameter $X_i$ in the absence of any other parametric variability, and $t_{ij}$ denotes a cross-term sensitivity of T to a set of parameters $X_i$ and $X_j$. Conceptually, $t_{ij}$ denotes the sensitivity of $t_i$ to $X_j$ (or vice-versa). Without any loss of generality, it is assumed that all parameters have 0 mean, and a subset of the parameters are modeled as Gaussian variables with unit variance (although some parameters like voltage are treated as non-statistical variables since they do not have a distribution and may be set adaptively during chip operation).

Statistical timing modeling and propagation with non-separable models are performed by projecting these models to various corners of the parametric space to obtain statistical timing models in a linear canonical form (without any cross terms). All statistical operations are performed on the linear models and the results combined to a non-separable statistical model. Consequently, interactions with linear statistical models and MIS are presented for illustration. The concept naturally extends for non-separable and other higher order statistical models. Single corner (or deterministic) timing values are denoted in lower case notation (for example, $d_i$), while statistical timing values are denoted in upper case notation (for example, $D_i$) for the remainder of the disclosure.

Statistical Timing Considering MIS

Given a gate arc from input i to an output, the statistical SIS delay of that arc $D_i$, a side gate input j, and statistical arrival times at these two inputs, this section presents approaches to compute the statistical delay $D_{ij}$ of that arc while considering MIS impacts from the side input j. It is assumed that the deterministic MIS scale factor model $\Theta_{ij}$ ($\delta_{ij}$) is available for the pair of inputs for given transitions and is a function of the deterministic skew $\delta_{ij}$ between the inputs.

In statistical timing, the statistical skew $\Delta_{ij}$ between the inputs is computed as a canonical form using statistical subtraction of the arrival times $\Delta_i$ and $\Delta_j$ at the inputs i and j, respectively. Mathematically, $$\Delta_{ij} = A_j - A_i. \quad (5)$$

Statistical MIS Scale Factor

The given MIS scale factor function $\Theta(\delta)$ is defined for a deterministic skew $\delta$. Given a statistical skew $\Delta$ with a known probability density function (PDF) p(x), the moments of the statistical scale factor function $\Theta(\Delta)$ can be computed via convolution. The mean value or expectation (E) of $\Theta(\Delta)$ is computed mathematically as:

$$E[\Theta(\Delta)] = \int_{-\infty}^{\infty} \Theta(x) p(x) dx. \quad (6)$$

As described in the section entitled Statistical Timing (Section III), the non-separable statistical timing model in (4) is projected to linear canonical models during statistical propagation and calculations. Each linear canonical model contains sensitivities to sources of variations that are considered to have Gaussian distributions. A statistical skew $\Delta$ in linear canonical form with mean $\mu$ and standard deviation $\sigma$ thereby has a PDF p(x) denoted as:

$$p(x) = \frac{1}{\sigma} \phi\left(\frac{x-\mu}{\sigma}\right), \text{ where,} \quad (7)$$

$$\phi(t) \triangleq \frac{1}{\sqrt{2\pi}} e^{-t^2/2}.$$

$$\Phi \triangleq \int_{-\infty}^{t} \phi(x) dx (\text{will be used below}). \quad (8)$$

The expected value of the statistical scale factor function is computed mathematically from (3), (6), (7) and (8) as follows.

$$E[\Theta(\Delta)] = \int_{-\infty}^{\infty} \Theta(x) p(x) dx = \frac{1}{\sigma}\int_{-\infty}^{\infty} \Theta(x) \phi\left(\frac{x-\mu}{\sigma}\right) dx \quad (9)$$

$$= \frac{1}{\sigma}\int_{-\infty}^{-\kappa} \Theta(x) \phi\left(\frac{x-\mu}{\sigma}\right) dx$$

$$+ \frac{1}{\sigma}\int_{-\kappa}^{0} \Theta(x) \phi\left(\frac{x-\mu}{\sigma}\right) dx$$

$$+ \frac{1}{\sigma}\int_{0}^{\kappa} \Theta(x) \phi\left(\frac{x-\mu}{\sigma}\right) dx$$

$$+ \frac{1}{\sigma}\int_{\kappa}^{\infty} \Theta(x) \phi\left(\frac{x-\mu}{\sigma}\right) dx$$

$$= \frac{1}{\sigma}\int_{-\infty}^{-\kappa} \phi\left(\frac{x-\mu}{\sigma}\right) dx + \frac{1}{\sigma}\int_{\kappa}^{\infty} \phi\left(\frac{x-\mu}{\sigma}\right) dx$$

$$+ \frac{\theta}{\sigma}\int_{-\kappa}^{\kappa} \phi\left(\frac{x-\mu}{\sigma}\right) dx$$

$$- \frac{(1-\theta)}{\kappa\sigma}\int_{-\kappa}^{0} x\phi\left(\frac{x-\mu}{\sigma}\right) dx$$

$$+ \frac{(1-\theta)}{\kappa\sigma}\int_{0}^{\kappa} x\phi\left(\frac{x-\mu}{\sigma}\right) dx.$$

-continued $$\text{Since } \int \frac{x}{\sigma}\phi\left(\frac{x-\mu}{\sigma}\right) dx = -\sigma^2 \phi\left(\frac{x-\mu}{\sigma}\right) + \mu \int \phi\left(\frac{x-\mu}{\sigma}\right) dx, \quad (10)$$

$$E[\Theta(\Delta)] = 1.0 + (1-\theta)\left[\Phi\left(\frac{-\kappa-\mu}{\sigma}\right) - \Phi\left(\frac{\kappa-\mu}{\sigma}\right)\right]$$

$$- \frac{(1-\theta)}{\kappa}\left[\sigma^2 \phi\left(\frac{-\kappa-\mu}{\sigma}\right) - \mu\Phi\left(\frac{-\kappa-\mu}{\sigma}\right)\right]$$

$$+ \frac{(1-\theta)}{\kappa}\left[-\sigma^2 \phi\left(\frac{\kappa-\mu}{\sigma}\right) + \mu\Phi\left(\frac{\kappa-\mu}{\sigma}\right)\right]$$

$$+ \frac{2(1-\theta)}{\kappa}\left[\sigma^2 \phi\left(\frac{-\mu}{\sigma}\right) - \mu\Phi\left(\frac{-\mu}{\sigma}\right)\right]$$

$$= 1.0 + (1-\theta)\left(1 + \frac{\mu}{\kappa}\right)\Phi\left(\frac{-\kappa-\mu}{\sigma}\right)$$

$$- (1-\theta)\left(1 - \frac{\mu}{\kappa}\right)\Phi\left(\frac{\kappa-\mu}{\sigma}\right)$$

$$- \frac{(1-\theta)\sigma^2}{\kappa}\left[\phi\left(\frac{-\kappa-\mu}{\sigma}\right) - \phi\left(\frac{\kappa-\mu}{\sigma}\right)\right]$$

$$+ \frac{2(1-\theta)}{\kappa}\left[\sigma^2 \phi\left(\frac{-\kappa-\mu}{\sigma}\right) - \mu\Phi\left(\frac{-\mu}{\sigma}\right)\right].$$

A closed form expression for the expected value of the statistical scale factor function is thus obtained in (10).

Statistical Delay Calculation Considering MIS

Based on (1) and (10), the mean value of the statistical delay $D_{ij}(\Delta_{ij})$ of a gate arc from pin i considering MIS impact from a side input j, given the arc's statistical SIS delay $D_i$ is obtained by taking the expected value of the delay as follows.

$$\mu_{D_{ij}} = E[D_{ij}(\Delta_{ij})] = E[D_i \cdot \times \Theta_{ij}(\Delta_{ij})] \quad (11)$$

$$\approx \mu_{D_i} \cdot \times E[(\Theta_{ij})(\Delta_{ij})].$$

The accuracy loss of the above approximation is found to be small when compared with Monte Carlo based simulations, and is presented in below.

Chain ruling is employed to compute the statistical MIS delay sensitivity to each source of variation X as follows.

$$\frac{\partial D_{ij}(X, \Delta)}{\partial X} = \Theta_{ij}(\Delta_{ij})\frac{\partial D_i(X)}{\partial X} + D_i(X)\frac{\partial \Theta_{ij}(\Delta(X))}{\partial X} \quad (12)$$

$$= \Theta_{ij}(\Delta_{ij})\frac{\partial D_i(X)}{\partial X}$$

$$+ D_i(X)\frac{\partial \Theta_{ij}(\Delta)}{\partial \Delta}\frac{\partial \Theta_{ij}(K)}{\partial X}.$$

Based on (3), the derivative of the deterministic MIS scale function is expressed as:

$$\frac{d\Theta(x)}{dx} = \begin{cases} \frac{(\theta-1)}{\kappa} & -\kappa < x < 0 \\ \frac{(1-\theta)}{\kappa} & 0 < x < \kappa \\ 0 & \text{otherwise.} \end{cases} \quad (13)$$

The expected value of $$\frac{\partial \Theta(\Delta)}{\partial \Delta}$$

can thereby be expressed as:

$$E\left[\frac{\partial \Theta(\Delta)}{\partial \Delta}\right] = -\frac{(1-\theta)}{\kappa\sigma}\int_{-\kappa}^{0}\phi\left(\frac{x-\mu}{\sigma}\right)dx + \quad (14)$$
$$\frac{(1-\theta)}{\kappa\sigma}\int_{0}^{\kappa}\phi\left(\frac{x-\mu}{\sigma}\right)dx$$
$$= \frac{(1-\theta)}{\kappa}\left[\Phi\left(\frac{-\kappa-\mu}{\sigma}\right) + \Phi\left(\frac{\kappa-\mu}{\sigma}\right)\right] -$$
$$\frac{2(1-\theta)}{\kappa}\Phi\left(\frac{-\mu}{\sigma}\right).$$

Expected values of $\Theta_{ij}(\Delta_{ij})$ from (10) and $$\frac{\partial \Theta(\Delta)}{\partial \Delta}$$

from (14) are used for sensitivity calculation in (12). The terms $$\frac{\partial D_i(X)}{\partial X} \text{ and } \frac{\partial \Delta_{ij}(X)}{\partial X}$$

denote the sensitivity of the SIS delay to source of variation X and the sensitivity of the statistical skew to X, respectively, and are available from their canonical forms. The mean statistical SIS delay is used for $D_i(X)$ in (12).

As described earlier, the above outlines the statistical delay computation approach while considering MIS for a projected linear statistical model. Multiple linear models are obtained using this approach for different corners, and then combined to obtain the non-separable statistical delay for a gate arc. A similar approach is used to obtain a statistical gate output slew considering MIS. Statistical timing analysis can now be performed in a traditional fashion.

Figure 8:
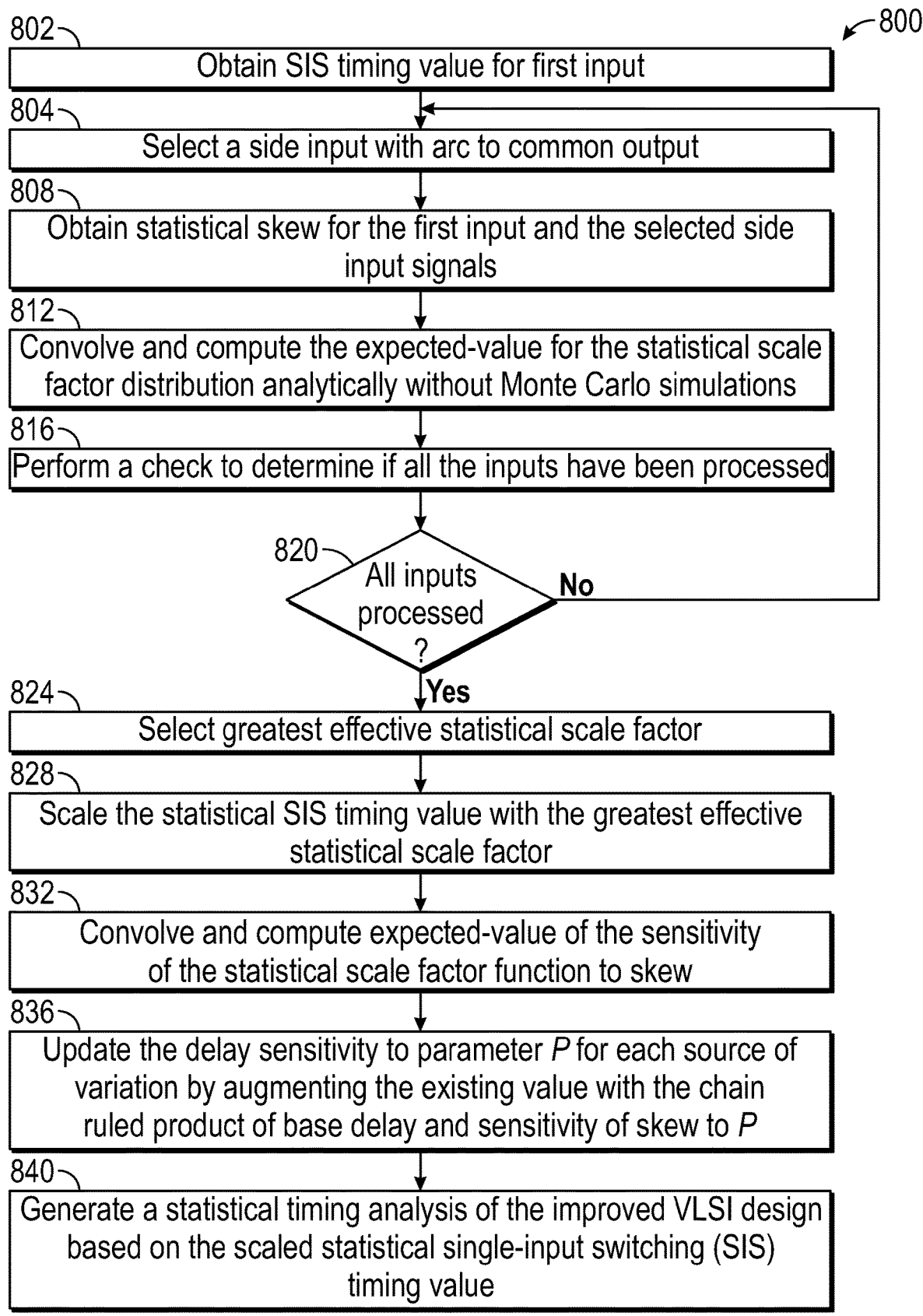
FIG. 8 is a flowchart of an example method for obtaining MIS-adjusted statistical delays for given gate arc (A→Y), in accordance with an example embodiment.

FIG. 8 is a flowchart of an example method 800 for obtaining MIS-adjusted statistical delays D for given gate arc (A→Y), in accordance with an example embodiment. In one example embodiment, a statistical single-input switching (SIS) timing value is obtained for a first input of a gate or transistor (operation 802). A side input with arc to a common output pin (illustrative side input B that has arc to output Y, as illustrated in FIGS. 1A and 1B) is selected (operation 804). The statistical skew (or delta-AT (X)) for the first input and the selected side input is obtained (operation 808). The expected-value E[ ] for the statistical scale factor distribution is convolved and computed analytically without Monte Carlo simulations (operation 812). In one example embodiment, the expected-value E[ ] is mathematically represented as:

$$SF(X) = \int_{-\infty}^{\infty} SF(t) PDF\left(\frac{t - \text{mean}(X)}{\text{sigma}(X)}\right)dt$$

Closed Form Expression for Gaussian Distribution Based Statistical Timing

This considers the statistical skew and the deterministic skew function described above, where PDF is the probability distribution of the skew and SF represents the scale factor, to determine the statistical scale factor.

A check is performed to determine if all the inputs have been processed (operation 816). If all the inputs have not been processed (NO branch of decision block 820), the method 800 proceeds with operation 804 and another input is selected. If all the inputs have been processed (YES branch of decision block 820), the worst-case effective scale factor is selected (operation 824) and the statistical single-input switching (SIS) timing value is scaled with the selected effective statistical scale factor obtained in operation 824 (operation 828). (If only one side input exists, the statistical single-input switching (SIS) timing value is essentially scaled with the effective statistical scale factor obtained in operation 812; therefore, operation 824 may be skipped.) Operation 828 scales the statistical timing value, such as statistical SIS delay values, including the mean delay and the sensitivities in the statistical single-input switching (SIS) delay value (operation 828).

In one example embodiment, the expected value of the "sensitivity of statistical scale factor function to skew" is convolved and computed (operation 832). In one example embodiment, the expected value of the "sensitivity of statistical scale factor function to skew" is represented mathematically as:

$$SF'(X) = \int_{-\infty}^{\infty}\left(\frac{d}{dt}SF(t)\right)PDF\left(\frac{t - \text{mean}(X)}{\text{sigma}(X)}\right)dt$$

Closed Form Expression for Gaussian Distribution Based Statistical Timing

For each source of variation (parameter P), the delay sensitivity to P is updated by augmenting the existing value with the chain-ruled product of base statistical timing value, SF'(X) from operation 832, and sensitivity of skew to P (operation 836). In essence, operation 832 is repeated for each source of variability. In one example embodiment, this is represented mathematically as:

$$\frac{dD}{dP} + = E[D] * SF'(X) * \frac{dX}{dP}$$

In one example embodiment, a statistical timing analysis of a given VLSI design is generated based on the scaled statistical single-input switching (SIS) timing value to create the improved VLSI circuit design (operation 840). In one example embodiment, the determined scale factors are cached and used in the future. In one example embodiment, other parameters are substituted for the statistical single-input switching (SIS) timing value. For example, a statistical single-input switching (SIS) output slew value may be used in place of the statistical single-input switching (SIS) delay value.

Extensions for Non-Separable and/or Quadratic Statistical Timing Models

The above embodiments can be extended to more complex statistical models. Non-separable and quadratic models encode multiple linear statistical models. The complex models can be conceptualized to contain multiple linear statistical models, and all operations on the complex models may be performed on each of the linear models, and the results can be re-encoded to a complex form. This idea applies to statistical MIS as well, wherein the aforementioned embodiments are applied to each of the decoded linear statistical delay models, and the results combined to form a new complex model that contains the impact of MIS.

Thus, in one example embodiment, a method for statistical timing analysis using an industry standard pre-characterized SIS timing library and deterministic scale factor based MIS models is disclosed. Specifically, the evaluation of gate timing in a statistical parameterized form while considering MIS is presented, and the accuracy of the result is compared to multiple prior approaches. A convolution and chain rule-based approach with a closed form solution is described for a two-input scenario and extended to multiple inputs. While a V shape MIS scale factor model is presented, the concepts are extensible to other scale factor models. Using polynomial or exponential shape scale factor models derived from circuit simulation results are also considered.

Given the discussion thus far, it will be appreciated that, in one aspect, a method comprises the operations of obtaining a statistical single-input switching (SIS) timing value for a first input of a device (operation 802); selecting a side input with an arc to a common output of a circuit (operation 804); obtaining a statistical skew for the first input and the selected side input of the circuit (operation 808); convolving and computing an expected-value for a statistical scale factor distribution based on the statistical skew (operation 812); scaling the statistical single-input switching (SIS) timing value with a final effective statistical scale factor based on the expected-value (operation 824); and generating a statistical timing analysis of a given VLSI design based on the scaled statistical single-input switching (SIS) timing value to create the improved VLSI circuit design (operation 840).

In essence, it is desired to carry out statistical timing for a given circuit (or gate) arc at this point; where an MIS un-aware statistical delay for the arc already has been computed, and the source of this arc is one of the inputs. The next step in one or more embodiments is to look at another arc of the same gate which has the same output as the given arc, but a different input. The input of this side arc is what is meant by "a side input."

In one example embodiment, the selecting the side input, obtaining the statistical skew, and convolving and computing the expected-value operations are repeated for each remaining side input; and a worst effective statistical scale factor is selected as the final effective statistical scale factor (operation 820). In one example embodiment, an expected value of a sensitivity of statistical scale factor function to skew is convolved and computed (operation 828); and, for each source of variation defined by parameter P, a delay sensitivity to the corresponding parameter P is updated by augmenting an existing value with a chain-ruled product of base delay, the expected value of the sensitivity of statistical scale factor function to skew, and a sensitivity of skew to the corresponding parameter P (operation 832). In one example embodiment, the expected-value is mathematically computed as:

$$SF(X) = \int_{\infty}^{\infty} SF(t) PDF\left(\frac{t - \text{mean}(X)}{\text{sigma}(X)}\right) dt$$

In one example embodiment, the expected value of the sensitivity of statistical scale factor function to skew is computed mathematically as:

$$SF'(X) = \int_{-\infty}^{\infty} \left(\frac{d}{dt} SF(t)\right) PDF\left(\frac{t - \text{mean}(X)}{\text{sigma}(X)}\right) dt$$

In one example embodiment, the delay sensitivity to P is updated by augmenting the existing value with chain-ruled product of base delay, the expected value of a sensitivity of statistical scale factor function to skew, and sensitivity of skew to P (operation 832) based on a formula:

$$\frac{dD}{dP} + = E[D] * SF'(X) * \frac{dX}{dP}$$

In one example embodiment, the final effective statistical scale factor is cached; and the cached final effective statistical scale factor is utilized during timing optimization operations for a same VLSI design.

In one aspect, a non-transitory computer readable medium comprises computer executable instructions which when executed by a computer cause the computer to perform the method of obtaining a statistical single-input switching (SIS) timing value for a first input of a device (operation 802); selecting a side input with an arc to a common output of a circuit (operation 804); obtaining a statistical skew for the first input and the selected side input of the circuit (operation 808); convolving and computing an expected-value for a statistical scale factor distribution based on the statistical skew (operation 812); scaling the statistical single-input switching (SIS) timing value with a final effective statistical scale factor based on the expected-value (operation 824); and generating a statistical timing analysis of a given VLSI design based on the scaled statistical single-input switching (SIS) timing value to create the improved VLSI circuit design (operation 840).

In one aspect, an apparatus comprises a memory; and at least one processor, coupled to said memory, and operative to perform operations comprising obtaining a statistical single-input switching (SIS) timing value for a first input of a device (operation 802); selecting a side input with an arc to a common output of a circuit (operation 804); obtaining a statistical skew for the first input and the selected side input of the circuit (operation 808); convolving and computing an expected-value for a statistical scale factor distribution based on the statistical skew (operation 812); scaling the statistical single-input switching (SIS) timing value with a final effective statistical scale factor based on the expected-value (operation 824); and generating a statistical timing analysis of a given VLSI design based on the scaled statistical single-input switching (SIS) timing value to create the improved VLSI circuit design (operation 840).

In one or more embodiments, a further step includes fabricating a physical integrated circuit. One non-limiting specific example of accomplishing this is described elsewhere herein in connection with FIGS. 10-12. For example, a design structure, based on the analyzed design, is provided to fabrication equipment to facilitate fabrication of a physical integrated circuit in accordance with the design structure.

In one or more embodiments, a layout is prepared based on the analysis. In one or more embodiments, the layout is instantiated as a design structure. In one or more embodiments, a physical integrated circuit is fabricated in accordance with the design structure.

As noted, in one or more embodiments, the layout is instantiated as a design structure. See discussion of FIG. 10. A physical integrated circuit is then fabricated in accordance with the design structure. See again discussion of FIG. 10. Refer also to FIG. 11. Once the physical design data is obtained, based, in part, on the design processes described herein, an integrated circuit designed in accordance therewith can be fabricated according to known processes that are generally described with reference to FIG. 10. Generally, a wafer with multiple copies of the final design is fabricated and cut (i.e., diced) such that each die is one copy of the integrated circuit. At block 1010, the processes include fabricating masks for lithography based on the finalized physical layout. At block 1020, fabricating the wafer includes using the masks to perform photolithography and etching. Once the wafer is diced, testing and sorting each die is performed at 1030 to filter out any faulty die.

One or more embodiments include a computer including a memory 28; and at least one processing unit 16, coupled to the memory, and operative to carry out or otherwise facilitate any one, some, or all of the method steps described herein.

Figure 10:
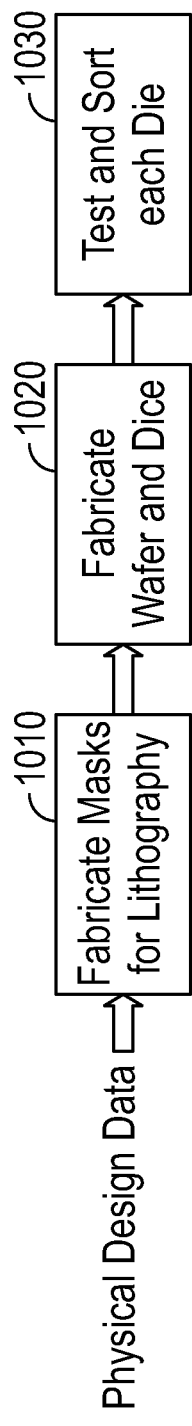
FIG. 10 is a flow diagram of a design process used in semiconductor design, manufacture, and/or test.
Figure 11:
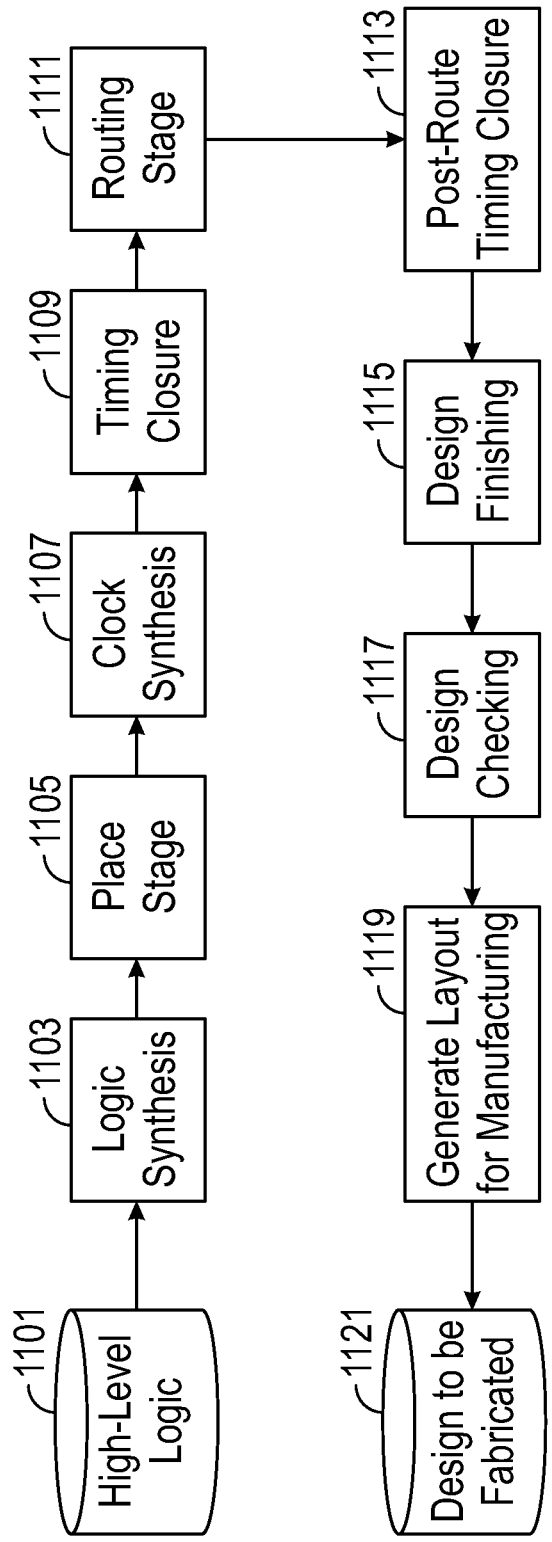
FIG. 11 shows further aspects of IC fabrication from physical design data.
Figure 12:
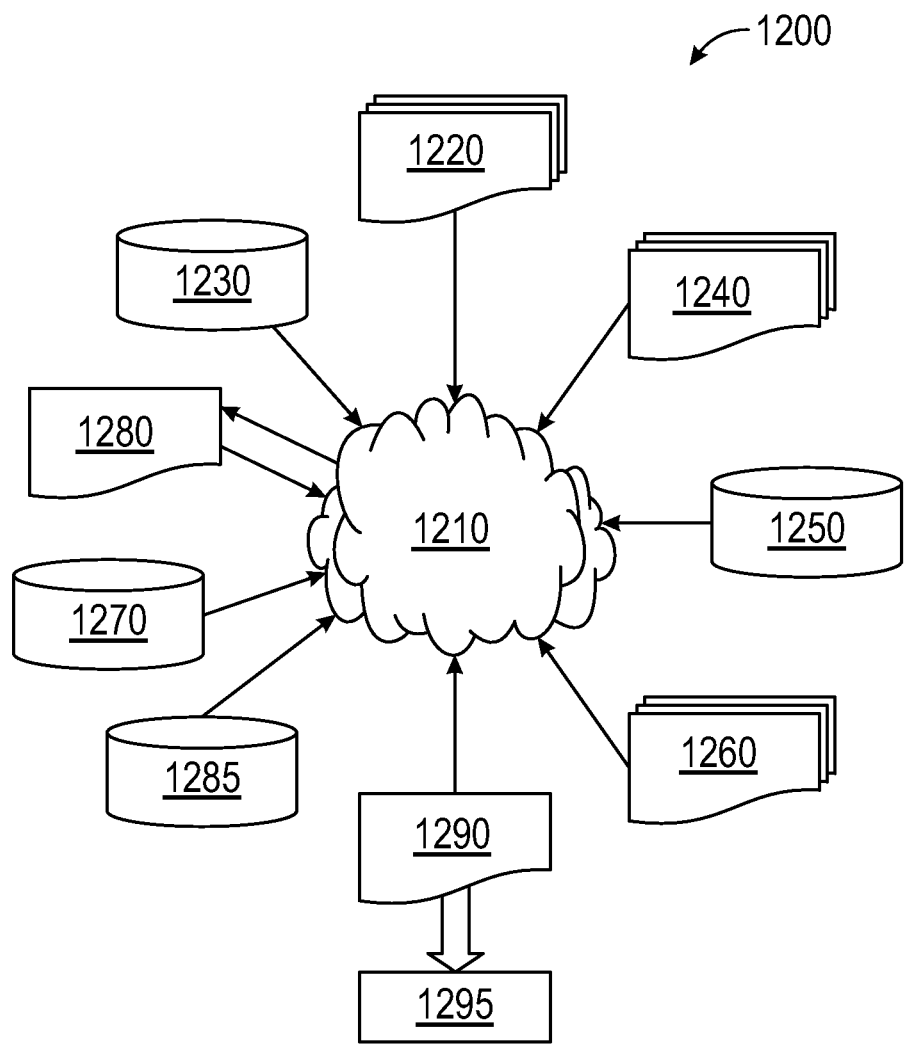
FIG. 12 shows an exemplary high-level Electronic Design Automation (EDA) tool flow, within which aspects of the invention can be employed.

Furthermore, referring to FIGS. 10-12, in one or more embodiments the at least one processor is operative to generate a design structure for the integrated circuit design in accordance with the VLSI design, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of proper prediction of timing critical paths due to MIS) compared to circuits designed using prior art techniques, at least under conditions where there is the same CPU time budget for the design process. To achieve similar improvements with prior-art techniques, even if possible, would require expenditure of more CPU time as compared to embodiments of the invention.

FIG. 11 depicts an example high-level Electronic Design Automation (EDA) tool flow, which is responsible for creating an optimized microprocessor (or other IC) design to be manufactured. A designer could start with a high-level logic description 1101 of the circuit (e.g. VHDL or Verilog). The logic synthesis tool 1103 compiles the logic, and optimizes it without any sense of its physical representation, and with estimated timing information. The placement tool 1105 takes the logical description and places each component, looking to minimize congestion in each area of the design. The clock synthesis tool 1107 optimizes the clock tree network by cloning/balancing/buffering the latches or registers. The timing closure step 1109 performs a number of optimizations on the design, including buffering, wire tuning, and circuit repowering; its goal is to produce a design which is routable, without timing violations, and without excess power consumption. The routing stage 1111 takes the placed/optimized design, and determines how to create wires to connect all of the components, without causing manufacturing violations. Post-route timing closure 1113 performs another set of optimizations to resolve any violations that are remaining after the routing. Design finishing 1115 then adds extra metal shapes to the netlist, to conform with manufacturing requirements. The checking steps 1117 analyze whether the design is violating any requirements such as manufacturing, timing, power, electromigration or noise. When the design is clean, the final step 1119 is to generate a layout for the design, representing all the shapes to be fabricated in the design to be fabricated 1121.

Figure 9:
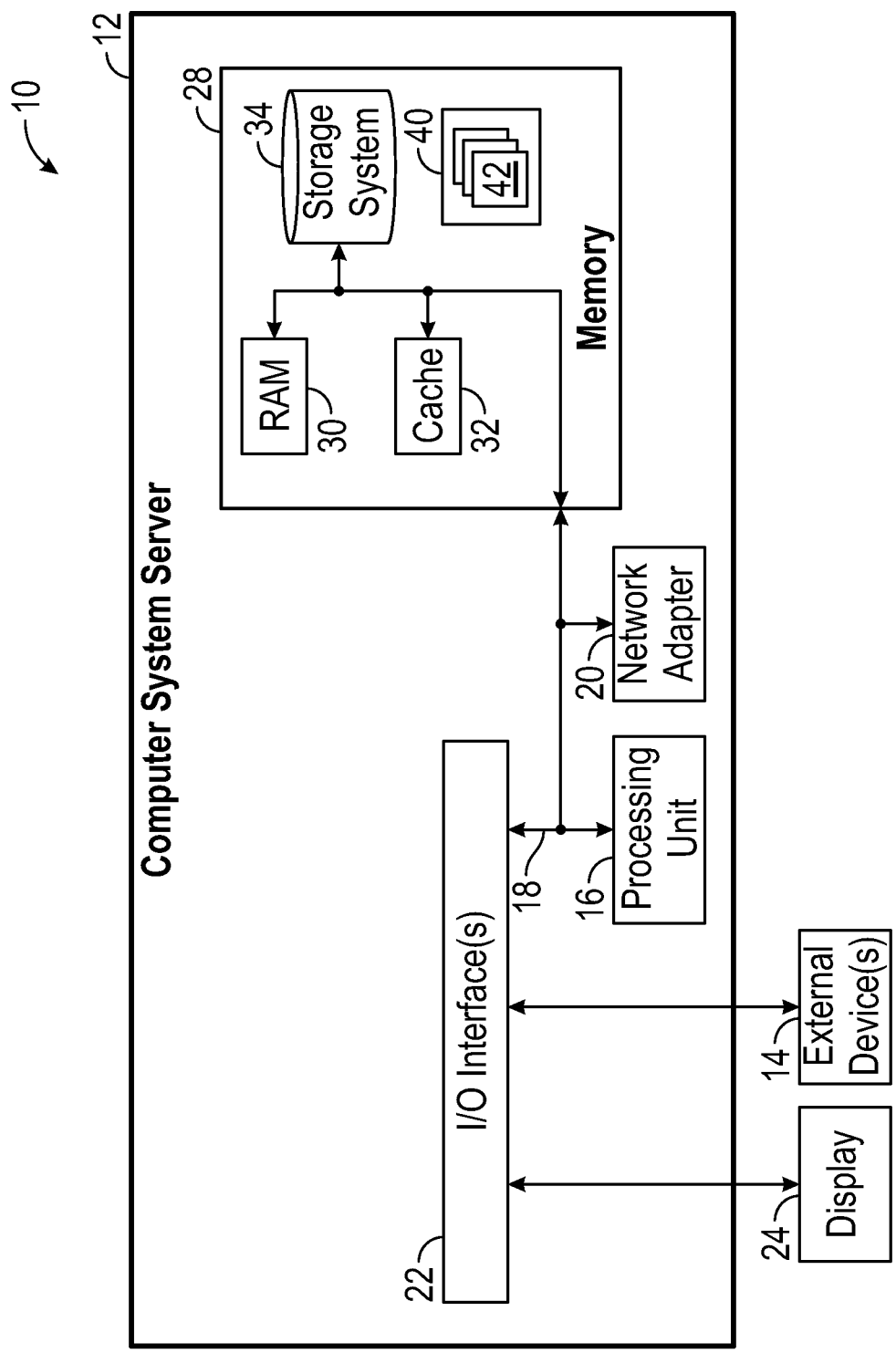
FIG. 9 depicts a computer system that may be useful in implementing one or more aspects and/or elements of the invention.

One or more embodiments of the invention, or elements thereof, can be implemented in the form of an apparatus including a memory and at least one processor that is coupled to the memory and operative to perform exemplary method steps. FIG. 9 depicts a computer system that may be useful in implementing one or more aspects and/or elements of the invention. The system is depicted as a cloud computing node 10 but is also representative of computer useful in non-cloud and/or hybrid implementations.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 9, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the timing analysis techniques herein with semiconductor integrated circuit design simulation, test, layout, and/or manufacture. In this regard, FIG. 12 shows a block diagram of an exemplary design flow 1200 used for example, in semiconductor IC logic design, simulation, test, layout, and manufacture.

Design flow 1200 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 1200 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a gate array or storage medium or the like, design structure 1220 may be accessed and processed by one or more hardware and/or software modules within design process 1210 to simulate or otherwise functionally represent an electronic component, circuit, electronic or logic module, apparatus, device, or system. As such, design structure 1220 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of components, circuits, devices, or logic structures to generate a Netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 1210 may include hardware and software modules for processing a variety of input data structure types including Netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc. Improved timing analysis can be performed as described herein.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 1290 may comprise a compiled, executable HDL simulation model that functionally simulates the devices to be analyzed.

Design structure 1290 may also employ a data format used for the exchange of layout data of integrated circuits and/or symbolic data format (e.g. information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 1290 may then proceed to a stage 1295 where, for example, design structure 1290: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for creating an improved very large scale integration (VLSI) circuit design, comprising:
   obtaining a statistical single-input switching (SIS) timing value for a first input of a device;
   selecting a side input with an arc to a common output of a circuit;
   obtaining a statistical skew between the first input and the selected side input of the circuit;
   convolving and computing an expected-value for a statistical scale factor distribution based on the statistical skew between the first input and the selected side input of the circuit to consider multiple-input switching;
   scaling the statistical single-input switching (SIS) timing value with a final effective statistical scale factor based on the expected-value; and
   generating a multiple-input switching statistical timing analysis of a given VLSI design based on the scaled statistical single-input switching (SIS) timing value to create the improved VLSI circuit design.

2. The method of claim 1, further comprising:
   repeating the selecting the side input, obtaining the statistical skew, and convolving and computing the expected-value operations for each remaining side input; and
   selecting a worst effective statistical scale factor as the final effective statistical scale factor.

3. The method of claim 1, further comprising:
   caching the final effective statistical scale factor; and
   utilizing the cached final effective statistical scale factor during timing optimization operations for a same VLSI design.

4. The method of claim 1, wherein the statistical single-input switching (SIS) timing value is a statistical single-input switching (SIS) delay value.

5. The method of claim 1, wherein the statistical single-input switching (SIS) timing value is a statistical single-input switching (SIS) output slew value.

6. The method of claim 1, wherein the expected-value is mathematically computed as:

$$SF(X) = \int_{-\infty}^{\infty} SF(t) PDF\left(\frac{t - \text{mean}(X)}{\text{sigma}(X)}\right) dt.$$

7. The method of claim 1, further comprising:
   convolving and computing an expected value of a sensitivity of statistical scale factor function to skew; and
   updating, for each source of variation defined by parameter P, a statistical timing value sensitivity to the corresponding parameter P by augmenting an existing value with a chain-ruled product of base statistical timing value, the expected value of the sensitivity of statistical scale factor function to skew, and a sensitivity of skew to the corresponding parameter P.

8. The method of claim 7, wherein the expected value of the sensitivity of statistical scale factor function to skew is computed mathematically as:

$$SF'(X) = \int_{-\infty}^{\infty} \left(\frac{d}{dt} SF(t)\right) PDF\left(\frac{t - \text{mean}(X)}{\text{sigma}(X)}\right) dt.$$

9. The method of claim 7, wherein the delay sensitivity to P is updated by augmenting the existing value with chain-ruled product of base statistical timing value, the expected value of a sensitivity of statistical scale factor function to skew, and sensitivity of skew to P based on a formula:

$$\frac{dD}{dP} += E[D] * SF'(X) * \frac{dX}{dP}.$$

10. A non-transitory computer readable medium comprising computer executable instructions which when executed by a computer cause the computer to perform the method of:
    obtaining a statistical single-input switching (SIS) timing value for a first input of a device;
    selecting a side input with an arc to a common output of a circuit;
    obtaining a statistical skew between the first input and the selected side input of the circuit;
    convolving and computing an expected-value for a statistical scale factor distribution based on the statistical skew between the first input and the selected side input of the circuit to consider multiple-input switching;
    scaling the statistical single-input switching (SIS) timing value with a final effective statistical scale factor based on the expected-value; and
    generating a multiple-input switching statistical timing analysis of a given VLSI design based on the scaled statistical single-input switching (SIS) timing value to create the improved VLSI circuit design.

11. The non-transitory computer readable medium of claim 10, the method further comprising:
    repeating the selecting the side input, obtaining the statistical skew, and convolving and computing the expected-value operations for each remaining side input; and
    selecting a worst effective statistical scale factor as the final effective statistical scale factor.

12. The non-transitory computer readable medium of claim 10, the method further comprising:
    convolving and computing an expected value of a sensitivity of statistical scale factor function to skew; and
    updating, for each source of variation defined by parameter P, a statistical timing value sensitivity to the corresponding parameter P by augmenting an existing value with a chain-ruled product of base statistical timing value, the expected value of the sensitivity of statistical scale factor function to skew, and a sensitivity of skew to the corresponding parameter P.

13. The non-transitory computer readable medium of claim 10, wherein the expected-value is mathematically computed as:

$$SF(X) = \int_{-\infty}^{\infty} SF(t) PDF\left(\frac{t - \text{mean}(X)}{\text{sigma}(X)}\right) dt.$$

14. The non-transitory computer readable medium of claim 10, the method further comprising:
caching the final effective statistical scale factor; and
utilizing the cached final effective statistical scale factor during timing optimization operations for a same VLSI design.

15. An apparatus comprising:
a memory; and
at least one processor, coupled to said memory, and operative to perform operations comprising:
obtaining a statistical single-input switching (SIS) timing value for a first input of a device;
selecting a side input with an arc to a common output of a circuit;
obtaining a statistical skew between the first input and the selected side input of the circuit;
convolving and computing an expected-value for a statistical scale factor distribution based on the statistical skew between the first input and the selected side input of the circuit to consider multiple-input switching;
scaling the statistical single-input switching (SIS) timing value with a final effective statistical scale factor based on the expected-value; and
generating a multiple-input switching statistical timing analysis of a given VLSI design based on the scaled statistical single-input switching (SIS) timing value to create the improved VLSI circuit design.

16. The apparatus of claim 15, the operations further comprising:
repeating the selecting the side input, obtaining the statistical skew, and convolving and computing the expected-value operations for each remaining side input; and
selecting a worst effective statistical scale factor as the final effective statistical scale factor.

17. The apparatus of claim 15, wherein the expected-value is mathematically computed as:

$$SF(X) = \int_{-\infty}^{\infty} SF(t) PDF\left(\frac{t - \text{mean}(X)}{\text{sigma}(X)}\right) dt.$$

18. The apparatus of claim 15, the operations further comprising:
convolving and computing an expected value of a sensitivity of statistical scale factor function to skew; and
updating, for each source of variation defined by parameter P, a statistical timing value sensitivity to the corresponding parameter P by augmenting an existing value with a chain-ruled product of base statistical timing value, the expected value of the sensitivity of statistical scale factor function to skew, and a sensitivity of skew to the corresponding parameter P.

19. The apparatus of claim 18, wherein the expected value of the sensitivity of statistical scale factor function to skew is computed mathematically as:

$$SF'(X) = \int_{-\infty}^{\infty} \left(\frac{d}{dt} SF(t)\right) PDF\left(\frac{t - \text{mean}(X)}{\text{sigma}(X)}\right) dt.$$

20. The apparatus of claim 18, wherein the delay sensitivity to P is updated by augmenting the existing value with chain-ruled product of base delay, the expected value of a sensitivity of statistical scale factor function to skew, and sensitivity of skew to P based on a formula:

$$\frac{dD}{dP} + = E[D] * SF'(X) * \frac{dX}{dP}.$$

* * * * *